United States Patent
Ieda et al.

(10) Patent No.: US 9,640,980 B2
(45) Date of Patent: May 2, 2017

(54) POWER INTERRUPTING DEVICE

(71) Applicant: Mitsubishi Electric Corporation, Tokyo (JP)

(72) Inventors: Masataka Ieda, Tokyo (JP); Shuya Sano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/110,432

(22) PCT Filed: Mar. 26, 2014

(86) PCT No.: PCT/JP2014/058496
§ 371 (c)(1),
(2) Date: Jul. 8, 2016

(87) PCT Pub. No.: WO2015/145610
PCT Pub. Date: Oct. 1, 2015

(65) Prior Publication Data
US 2016/0336735 A1    Nov. 17, 2016

(51) Int. Cl.
*G01R 31/327* (2006.01)
*H02H 7/00* (2006.01)
(Continued)

(52) U.S. Cl.
CPC ........... *H02H 7/008* (2013.01); *G01R 31/327* (2013.01); *H02H 7/0844* (2013.01); *H02J 1/00* (2013.01);
(Continued)

(58) Field of Classification Search
CPC .............................. G01R 31/327; H02H 7/008
See application file for complete search history.

(56) References Cited

U.S. PATENT DOCUMENTS 6,034,449 A    3/2000  Sakai et al.
6,047,634 A    4/2000  Futsuhara et al.
(Continued)

FOREIGN PATENT DOCUMENTS

DE    37 32 079 A1    4/1989
JP    62-297765 A     12/1987
(Continued)

OTHER PUBLICATIONS

Examination Report from the Intellectual Property Office issued in TW 103134172 dated Feb. 18, 2016.
(Continued)

*Primary Examiner* — Scott Bauer
(74) *Attorney, Agent, or Firm* — Sughrue Mion, PLLC; Richard C. Turner (57) ABSTRACT

A power interrupting device has: an output terminal connected to a load; interruption circuits connected in parallel between a power source and the output terminal; and a control device controlling each interruption circuit. Each interruption circuit has: a switch element connected between the power source and an intermediate node, and ON/OFF controlled by an interruption signal output from the control device; and a rectifier connected such that a forward direction thereof is from the intermediate node to the output terminal. The control device sets the interruption circuits as a diagnosis target circuit in turn. The control device sets the interruption signal output to each interruption circuit such that the switch element of the diagnosis target circuit is OFF. Moreover, the control device determines, based on a voltage of the intermediate node of the diagnosis target circuit, whether an abnormality occurs in the diagnosis target circuit.

4 Claims, 7 Drawing Sheets

(51) Int. Cl.
| | |
|---|---|
| *H02H 7/08* | (2006.01) |
| *H02J 1/00* | (2006.01) |
| *H02M 7/5387* | (2007.01) |
| *H02P 3/18* | (2006.01) |
| *H02P 27/08* | (2006.01) |
| *H02H 3/04* | (2006.01) |
| *H02H 3/05* | (2006.01) |

(52) U.S. Cl.
CPC ............ *H02M 7/5387* (2013.01); *H02P 3/18* (2013.01); *H02P 27/08* (2013.01); *H02H 3/04* (2013.01); *H02H 3/05* (2013.01)

(56) References Cited

U.S. PATENT DOCUMENTS

| | | |
|---|---|---|
| 8,476,860 B2 | 7/2013 | Sato |
| 8,497,715 B2 * | 7/2013 | Kanayama ........... G01R 31/026 326/83 |
| 2011/0169470 A1 | 7/2011 | Itakura |

FOREIGN PATENT DOCUMENTS

| | | | |
|---|---|---|---|
| JP | 02-148630 | A | 6/1990 |
| JP | 2003158447 | A * | 5/2003 |
| JP | 2005-044074 | A | 2/2005 |
| JP | 2010-108129 | A | 5/2010 |
| JP | 2011-182535 | A | 9/2011 |
| JP | 2012-182892 | A | 9/2012 |
| JP | 2012-244866 | A | 12/2012 |
| JP | 2014-029943 | A | 2/2014 |
| KR | 10-2011-0042240 | A | 4/2011 |
| WO | 98/10452 | A1 | 3/1998 |

OTHER PUBLICATIONS

Notice of Rejection issued in JP 2015-515740 dated May 12, 2015.
Decision of a Patent Grant issued in JP 2015-515740 dated Oct. 13, 2015.
International Search Report of PCT/JP2014/058496 dated Jun. 17, 2014.
Communication dated Nov. 18, 2016, from the Korean Intellectual Property Office, in counterpart Korean application No. 10-2016-7022825, 6 pages.

* cited by examiner

POWER INTERRUPTING DEVICE

CROSS REFERENCE TO RELATED APPLICATIONS

This application is a National Stage of International Application No. PCT/JP2014/058496 filed Mar. 26, 2014, the contents of which are incorporated herein by reference in its entirety.

FIELD

The present invention relates to a power interrupting device.

BACKGROUND

In recent years, according to widespread of electrical equipment such as motors, an abnormal operation of the electrical equipment is more and more likely to lead a serious accident, and it is thus required to reduce risks of the accident as much as possible. International standards are defined in order to reduce the risks to be within an allowable range. IEC61508 is defined as a standard regarding electrical equipment, and IEC61800-5-2 defined as a standard regarding driving equipment such as motors.

A Safe Torque-Off function (STO) is known as a safety function defined in the IEC61800-5-2. When externally receiving an interruption instruction, the Safe Torque-Off function interrupts power supply to a motor to stop an operation of the motor. To be able to surely interrupt power supply when required is an important function in terms of safety, which is not limited to the case of the motor. To that end, it is important to periodically "diagnose" whether or not a power interrupting device for interrupting power supply normally operates.

Patent Literature 1 discloses a technique that monitors whether or not there is an abnormality in an interrupting device in an operating condition. More specifically, the interrupting device uses gate signals to interrupt PWM signals supplied from a control device to a bridge circuit. A monitoring device generates a test signal to diagnose the interrupting device. A switching circuit switches the test signal and an external interruption signal. A delay circuit permits passage of an output signal from the switching circuit after elapse of a set time from a change point of the output signal. An input signal to the delay circuit is fed back, as a feedback signal, to the monitoring device. The monitoring device outputs the test signal to the interrupting device at an interval shorter than the delay time and determines whether or not the feedback signal coincides with the test signal.

CITATION LIST

Patent Literature

Patent Literature 1: Japanese Patent Application Laid-Open No. 2011-182535

SUMMARY

Technical Problem

As described above, it is important from a viewpoint of ensuring safety to periodically diagnose whether or not a power interrupting device for interrupting power supply operates normally. However, if the power interrupting device is normal at a time of the diagnosis, the power supply to a load is interrupted and thus an operation of the load stops. That is, productivity is deteriorated in return for the diagnosis.

An object of the present invention is to provide a technique that can diagnose, without stopping power supply to a load, whether or not a power interrupting device normally operates.

Solution to Problem

In an aspect of the present invention, a power interrupting device is provided. The power interrupting device has: an output terminal connected to a load; a plurality of interruption circuits connected in parallel between a power source and the output terminal; and a control device to control each of the interruption circuits. Each of the interruption circuits has: a switch element connected between the power source and an intermediate node, and ON/OFF controlled by an interruption signal output from the control device; and a rectifier connected such that a forward direction thereof is from the intermediate node to the output terminal. The control device sets the interruption circuits as a diagnosis target circuit in turn. The control device sets the interruption signal output to each of the interruption circuits such that the switch element of the diagnosis target circuit is OFF. Further, the control device determines, based on a voltage of the intermediate node of the diagnosis target circuit, whether or not an abnormality occurs in the diagnosis target circuit.

Advantageous Effects of Invention

According to the present invention, it is possible to diagnose, without stopping power supply to a load, whether or not a power interrupting device normally operates.

DESCRIPTION OF EMBODIMENTS

Embodiments of the present invention will be described with reference to the accompanying drawings.

First Embodiment

Figure 1:
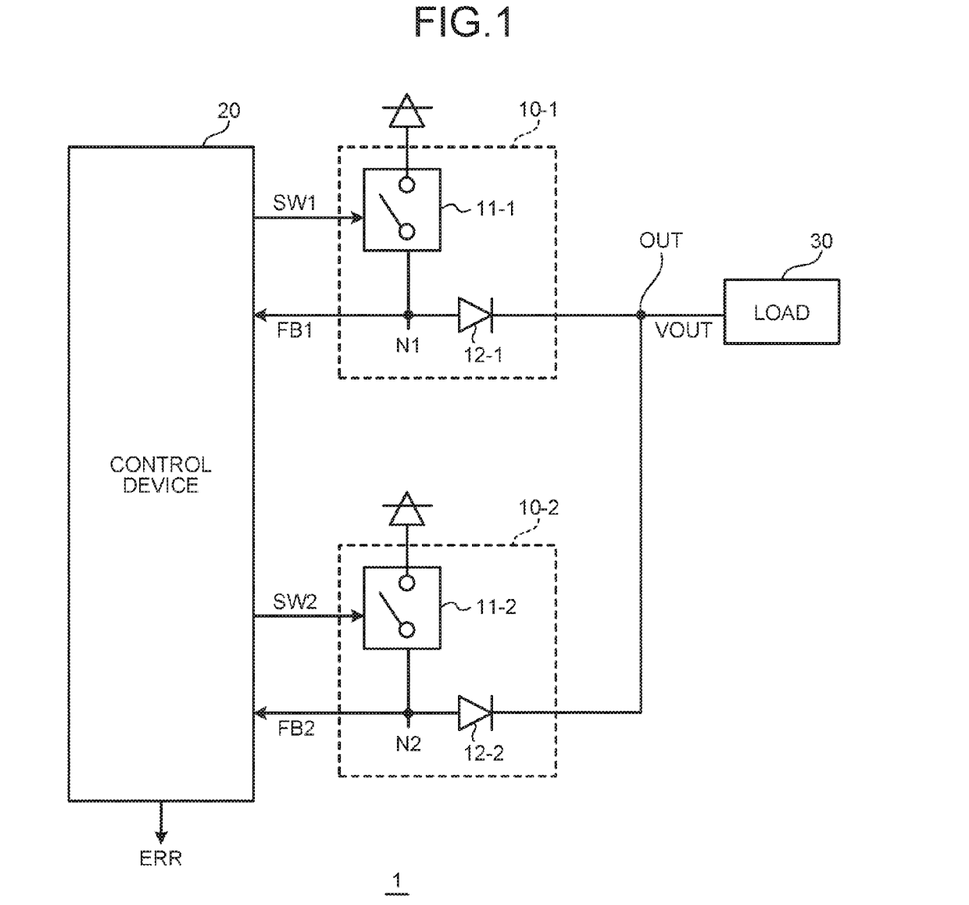
FIG. 1 is a block diagram showing a configuration example of a power interrupting device according to a first embodiment of the present invention.

FIG. 1 is a block diagram showing a configuration example of a power interrupting device 1 according to a first embodiment of the present invention. The power interrupting device 1 is provided between a power source and a load 30, and has a function of controlling power supply from the power source to the load 30. In particular, the power interrupting device 1 has a function of interrupting the power supply to the load 30 if necessary.

More specifically, the power interrupting device 1 has an output terminal OUT, a plurality of interruption circuits 10, and a control device 20. The output terminal OUT is connected to the load 30.

The plurality of interruption circuits 10 are connected in parallel between the power source and the output terminal OUT. In the example shown in FIG. 1, two interruption circuits 10, that is, a first interruption circuit 10-1 and a second interruption circuit 10-2 are shown. Each of the interruption circuits 10 permits or prohibits (interrupts) passage of electric power from the power source to the output terminal OUT according to an interruption signal from the control device 20 explained below.

More specifically, each interruption circuit 10 has a switch element 11 and a rectifier 12 connected in series between the power source and the output terminal OUT.

For example, in the first interruption circuit 10-1, a first switch element 11-1 is connected between the power source and a first intermediate node N1, and a first rectifier 12-1 is connected between the first intermediate node N1 and the output terminal OUT. The first switch element 11-1 is ON/OFF controlled by a first interruption signal SW1 output from the control device 20. When the first interruption signal SW1 is ON, the first switch element 11-1 is ON and permits passage of electric power. On the other hand, when the first interruption signal SW1 is OFF, the first switch element 11-1 is OFF and interrupts passage of electric power. The first rectifier 12-1 is connected such that a forward direction thereof is a direction from the first intermediate node N1 to the output terminal OUT.

Similarly, in the second interruption circuit 10-2, a second switch element 11-2 is connected between the power source and a second intermediate node N2, and a second rectifier 12-2 is connected between the second intermediate node N2 and the output terminal OUT. The second switch element 11-2 is ON/OFF controlled by a second interruption signal SW2 output from the control device 20. When the second interruption signal SW2 is ON, the second switch element 11-2 is ON and permits passage of electric power. On the other hand, when the second interruption signal SW2 is OFF, the second switch element 11-2 is OFF and interrupts passage of electric power. The second rectifier 12-2 is connected such that a forward direction thereof is a direction from the second intermediate node N2 to the output terminal OUT.

The control device 20 is realized by a microcomputer, for example. The control device 20 controls each of the interruption circuits 10 separately. Specifically, the control device 20 uses the above-mentioned first interruption signal SW1 to control an operation of the first interruption circuit 10-1. Also, the control device 20 uses the above-mentioned second interruption signal SW2 to control an operation of the second interruption circuit 10-2.

Moreover, a first feedback signal FB1 indicating a voltage of the first intermediate node N1 and a second feedback signal FB2 indicating a voltage of the second intermediate node N2 are input to the control device 20. As will be described below, the control device 20 can detect an abnormality in each interruption circuit 10 by monitoring the first feedback signal FB1 and the second feedback signal FB2. When detecting an abnormality, the control device 20 outputs an error signal ERR.

At a time of a normal operation, the control device 20 causes all the interruption circuits 10 to pass electric power. When it is desired to stop the power supply to the load 30, for example in case of emergency, the control device 20 causes all the interruption circuits 10 to interrupt the passage of electric power. At this time, if any of the interruption circuits 10 is failing, the power supply to the load 30 does not stop but continues. In order to secure safety, it is preferable to "diagnose" at an arbitrary timing whether each interruption circuit 10 normally operates.

Figure 2:
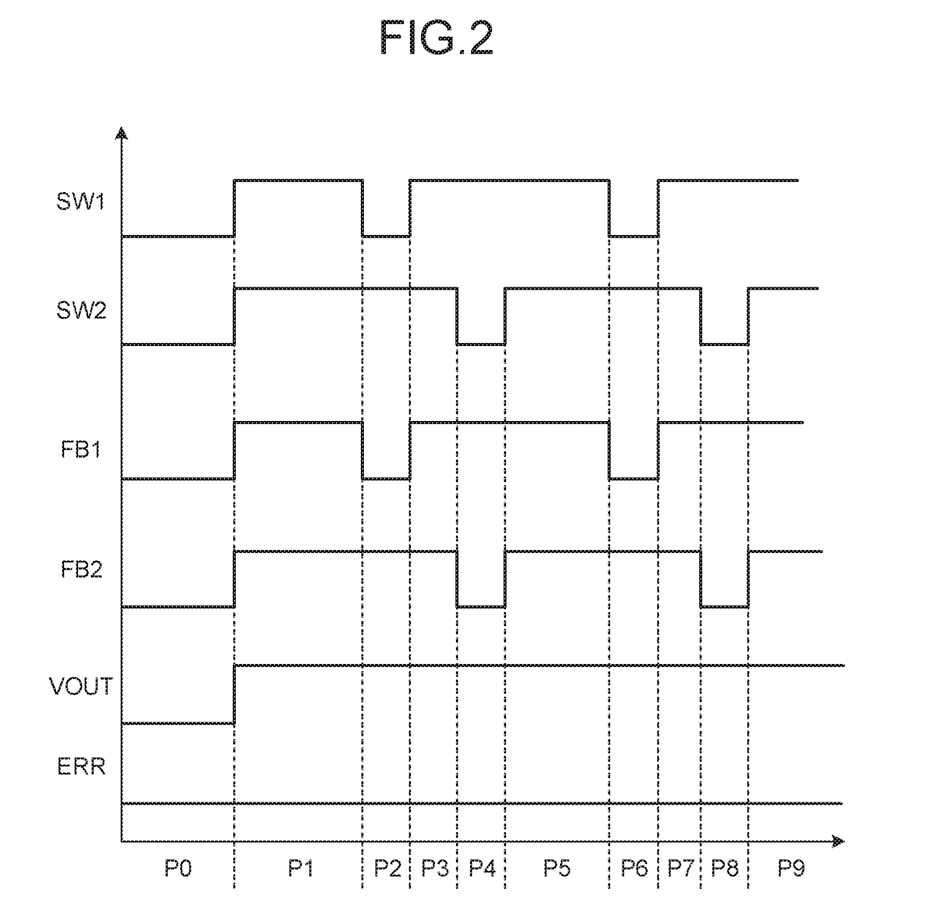
FIG. 2 is a timing chart showing an example of an operation of the power interrupting device according to the first embodiment of the present invention.

Diagnosis of the first interruption circuit 10-1 and the second interruption circuit 10-2 shown in FIG. 1 will be explained with reference to FIG. 2. In FIG. 2, the first interruption signal SW1, the second interruption signal SW2, the first feedback signal FB1, the second feedback signal FB2, an output voltage VOUT being a voltage of the output terminal OUT, and the error signal ERR are shown.

In a period P0, the power interrupting device 1 is in a power OFF state, and each circuit stops operating. After that, the power interrupting device 1 is powered ON.

A period P1 is a normal operation period. The control device 20 turns ON both of the first interruption signal SW1 and the second interruption signal SW2 (SW1=High, SW2=High). As a result, both of the first switch element 11-1 and the second switch element 11-2 are turned ON, and both of the first feedback signal FB1 and the second feedback signal FB2 become a power source voltage level (FB1=High, FB2=High). Electric power is supplied to the load 30 (VOUT=High), and the load 30 operates.

The subsequent period P2 is a period for diagnosing the first interruption circuit 10-1. The control device 20 sets the first interruption circuit 10-1 as a "diagnosis target circuit". Specifically, the control device 20 turns OFF the first interruption signal SW1 (SW1=Low) to turn OFF the first switch element 11-1 of the first interruption circuit 10-1.

If the first switch element 11-1 is normally turned OFF, the first intermediate node N1 and the power source are electrically disconnected from each other, and the first feedback signal FB1 is expected to be Low level as shown in FIG. 2. Therefore, the control device 20 can determine, by monitoring the first feedback signal FB1 in the period P2, whether or not the first interruption circuit 10-1 operates normally (in other words, whether or not an abnormality is occurring in the first interruption circuit 10-1).

It should be noted here that a state of the second interruption circuit 10-2 in the period P2 remains the same as in the normal operation period. That is, the power supply from the power source to the load 30 continues through the second interruption circuit 10-2 (VOUT=High). This means that diagnosis of the first interruption circuit 10-1 is possible without stopping the power supply to the load 30. At this time, the first rectifier 12-1 plays a role of preventing that electric power is supplied from the output terminal OUT back to the first intermediate node N1 to adversely affect the diagnosis of the first interruption circuit 10-1.

If the first feedback signal FB1 changes to Low level being the expected value, the control device 20 determines that the first interruption circuit 10-1 is normal. On the other hand, if the first feedback signal FB1 remains at High level, the control device 20 determines that an abnormality is occurring in the first interruption circuit 10-1. In the example shown in FIG. 2, the first interruption circuit 10-1 is normal.

In this case, the control device 20 returns the first interruption circuit 10-1 back to the normal operation to resume the power supply.

The subsequent period P3 is a normal operation period and is the same as the above-mentioned period P1.

The subsequent period P4 is a period for diagnosing the second interruption circuit 10-2. The control device 20 sets the second interruption circuit 10-2 as a "diagnosis target circuit". Specifically, the control device 20 turns OFF the second interruption signal SW2 (SW=Low) to turn OFF the second switch element 11-2 of the second interruption circuit 10-2.

If the second switch element 11-2 is normally turned OFF, the second intermediate node N2 and the power source are electrically disconnected from each other, and the second feedback signal FB2 is expected to be Low level as shown in FIG. 2. Therefore, the control device 20 can determine, by monitoring the second feedback signal FB2 in the period P4, whether or not the second interruption circuit 10-2 operates normally (in other words, whether or not an abnormality is occurring in the second interruption circuit 10-2).

It should be noted here that a state of the first interruption circuit 10-1 in the period P4 remains the same as in the normal operation period. That is, the power supply from the power source to the load 30 continues through the first interruption circuit 10-1 (VOUT=High). This means that diagnosis of the second interruption circuit 10-2 is possible without stopping the power supply to the load 30. At this time, the second rectifier 12-2 plays a role of preventing that electric power is supplied from the output terminal OUT back to the second intermediate node N2 to adversely affect the diagnosis of the second interruption circuit 10-2.

If the second feedback signal FB2 changes to Low level being the expected value, the control device 20 determines that the second interruption circuit 10-2 is normal. On the other hand, if the second feedback signal FB2 remains at High level, the control device 20 determines that an abnormality is occurring in the second interruption circuit 10-2. In the example shown in FIG. 2, the second interruption circuit 10-2 is normal. In this case, the control device 20 returns the second interruption circuit 10-2 back to the normal operation to resume the power supply.

The subsequent period P5 is a normal operation period and is the same as the above-mentioned period P1. The subsequent period P6 is a period for diagnosing the first interruption circuit 10-1 and is the same as the above-mentioned period P2. The subsequent period P7 is a normal operation period and is the same as the above-mentioned period P1. The subsequent period P8 is a period for diagnosing the second interruption circuit 10-2 and is the same as the above-mentioned period P4. The subsequent period P9 is a normal operation period and is the same as the above-mentioned period P1.

In this manner, the control device 20 alternately turns ON/OFF the first interruption signal SW1 and the second interruption signal SW2 to alternately set the first interruption circuit 10-1 and the second interruption circuit 10-2 as the diagnosis target circuit. That is, the control device 20 sets the plural interruption circuits 10 as the diagnosis target circuit in turn. As a result, it is possible to carry out diagnosis of the diagnosis target circuit without stopping the power supply to the load 30.

Figure 3:
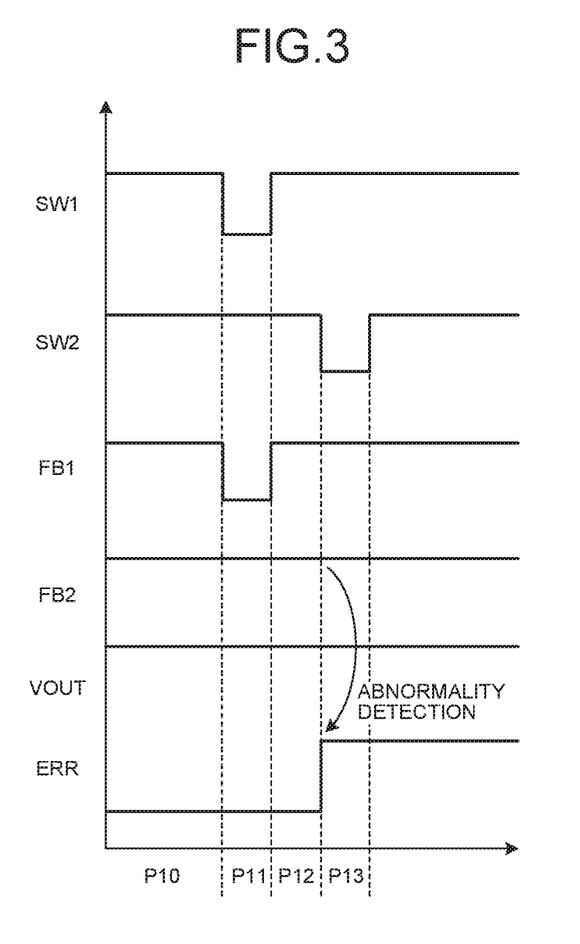
FIG. 3 is a timing chart showing another example of the operation of the power interrupting device according to the first embodiment of the present invention.

Next, let us explain a case where an abnormality is occurring in the diagnosis target circuit. FIG. 3 shows, as an example, a case where an abnormality has occurred in the second interruption circuit 10-2. A period P10 is a normal operation period and is the same as the above-mentioned period P1. The subsequent period P11 is a period for diagnosing the first interruption circuit 10-1 and is the same as the above-mentioned period P2. The subsequent period P12 is a normal operation period and is the same as the above-mentioned period P1.

The subsequent period P13 is a period for diagnosing the second interruption circuit 10-2. The control device 20 sets the second interruption circuit 10-2 as the "diagnosis target circuit" and turns OFF the second interruption signal SW2 (SW2=Low). However, the second feedback signal FB2 remains at High level. Therefore, the control device 20 determines that an abnormality is occurring in the second interruption circuit 10-2. In this case, the control device 20 outputs the error signal ERR (ERR=High) to notify an operator of the abnormality detection.

According to the present embodiment, as described above, it is possible to individually diagnose each of the interruption circuits 10. While any of the interruption circuits 10 is set as the diagnosis target circuit, the other interruption circuits 10 are operating as usual. It is therefore possible to carry out the diagnosis of the diagnosis target circuit without stopping the power supply to the load 30.

Note that it is preferable to periodically carry out the diagnosis in order to continuously secure reliability of the power interrupting device 1. That is, it is preferable that the control device 20 periodically sets each of the interruption circuits 10 as the diagnosis target circuit.

Figure 4:
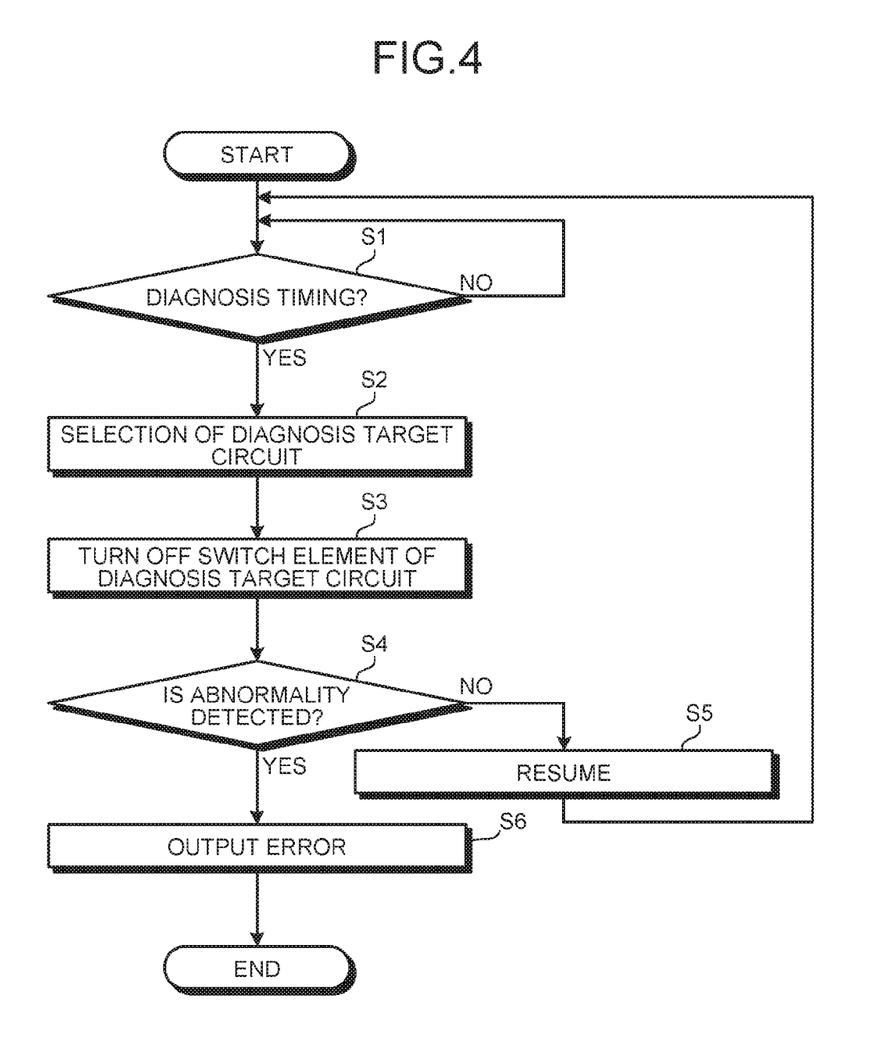
FIG. 4 is a flowchart schematically showing a method of diagnosing the power interrupting device according to the first embodiment of the present invention.

FIG. 4 is a flowchart schematically showing the diagnosis method according to the present embodiment. The control device 20 continues a normal operation until diagnosis timing (Step S1; No). When the diagnosis timing comes (Step S1; Yes), the control device 20 selects a diagnosis target circuit out of the interruption circuits 10 (Step S2). For example, the control device 20 selects the interruption circuits 10 as the diagnosis target circuit in turn.

Subsequently, the control device 20 stops electric power passage in the diagnosis target circuit. More specifically, the control device 20 turns OFF the switch element 11 of the diagnosis target circuit (Step S3). Then, the control device 20 determines, based on a voltage of the intermediate node of the diagnosis target circuit, whether or not an abnormality is occurring in the diagnosis target circuit (Step S4).

If no abnormality is detected in the diagnosis target circuit (Step S4; No), the control device 20 returns the diagnosis target circuit back to the normal operation to resume the electric power passage (Step S5). On the other hand, If an abnormality is detected in the diagnosis target circuit (Step S4; Yes), the control device 20 outputs an error signal ERR (Step S6).

According to the present embodiment, as described above, the interruption circuits 10 are provided in parallel. It is possible to individually diagnose each of the interruption circuits 10. While any of the interruption circuits 10 is set as the diagnosis target circuit, the other interruption circuits 10 are operating as usual. Therefore, it is possible to carry out the diagnosis of the diagnosis target circuit without stopping the power supply to the load 30. That is, it is possible to secure reliability of the power interrupting device 1 while stably supplying electric power to the load 30.

Furthermore, according to the present embodiment, it is enough to turn OFF the interruption circuits 10 in turn, and it is not necessary to strictly control the OFF period. That is, it is not necessary for the diagnosis to strictly control the OFF periods of the interruption signals SW1 and SW2. This is preferable in terms of easiness of circuit design and a reduction in manufacturing costs.

Second Embodiment

Figure 5:
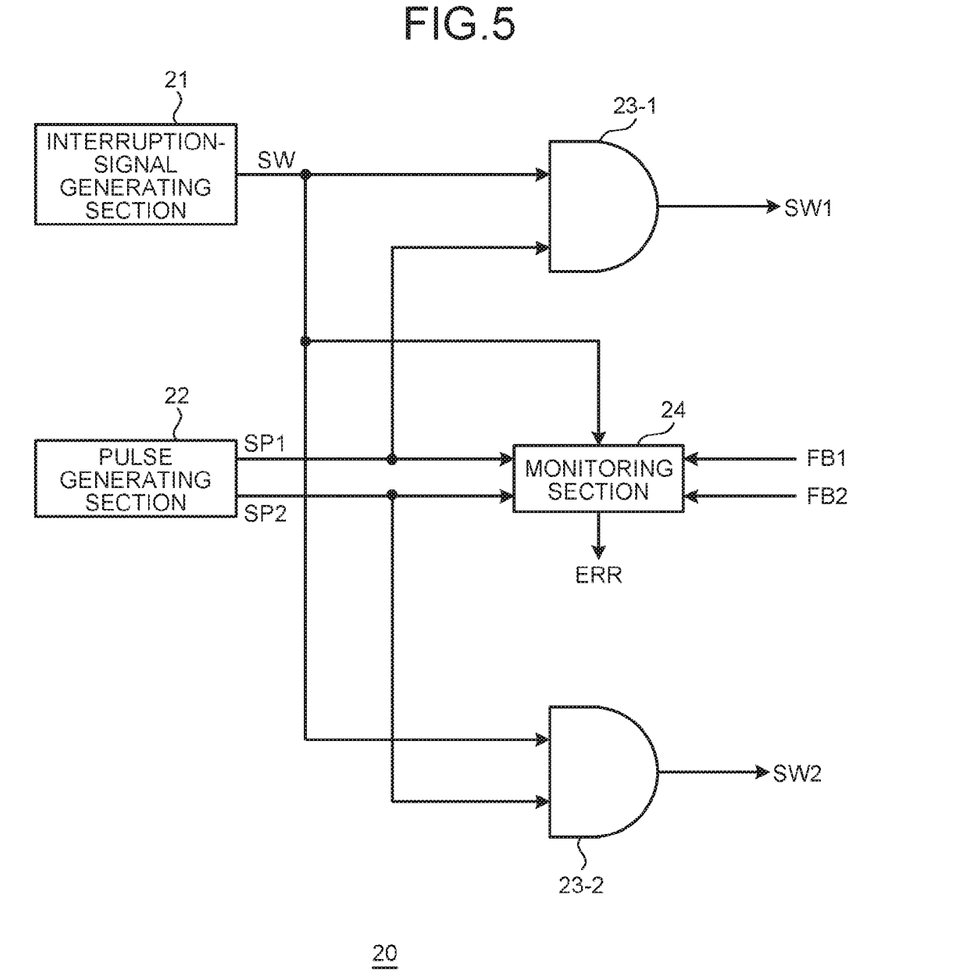
FIG. 5 is a block diagram showing a configuration example of a control device of a power interrupting device according to a second embodiment of the present invention.
Figure 6:
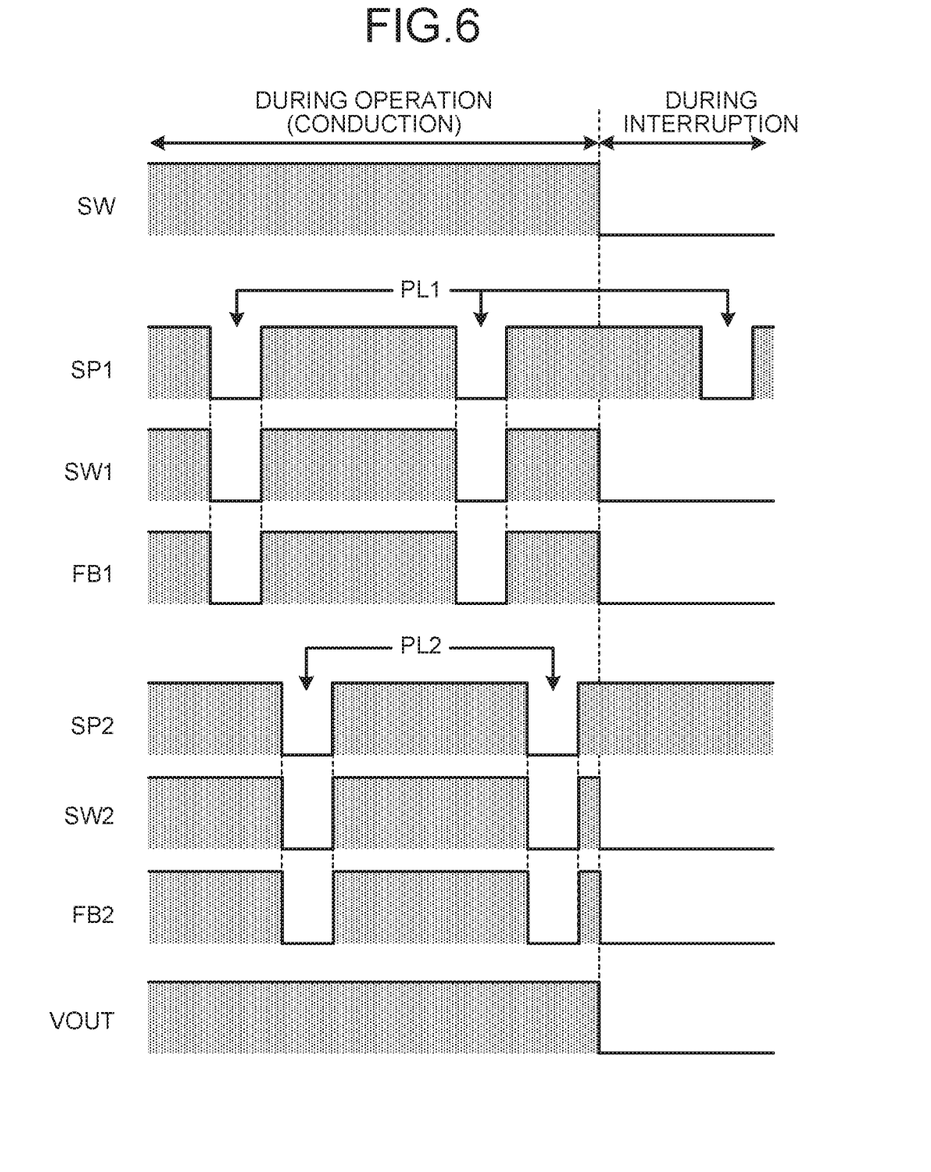
FIG. 6 is a timing chart showing an example of an operation of the power interrupting device according to the second embodiment of the present invention.

In a second embodiment of the present invention, a concrete example of the control device 20 will be explained. FIG. 5 is a block diagram showing a configuration example of the control device 20 according to the present embodiment. FIG. 6 is a timing chart showing an operation example of the power interrupting device 1 in the present embodiment.

The control device 20 has functional blocks such as an interruption-signal generating section 21, a pulse generating section 22, a first combining section 23-1, a second combining section 23-2, and a monitoring section 24. These functional blocks are realized, for example, by a microcomputer executing a program. Alternatively, these functional blocks can be realized by electric circuits.

The interruption-signal generating section 21 generates a common interruption signal SW in accordance with an external input (not shown). As shown in FIG. 6, the common interruption signal SW is set to High during a driving operation of the load 30. On the other hand, the common interruption signal SW is set to Low when the power supply to the load 30 is interrupted.

The pulse generating section 22 outputs a first signal SP1 to the first combining section 23-1, and outputs a second signal SP2 to the second combining section 23-2. In a normal operation period, both of the first signal SP1 and the second signal SP2 are at High level.

When the first interruption circuit 10-1 is set as a "diagnosis target circuit", the pulse generating section 22 sets the first signal SP1 to Low level for a fixed period, as shown in FIG. 6. That is, the pulse generating section 22 generates a first pulse signal PL1 of Low level and outputs the first pulse signal PL1 as the first signal SP1. It can be said that the first pulse signal PL1 is a test pulse for setting the first interruption circuit 10-1 as the "diagnosis target circuit".

Similarly, when the second interruption circuit 10-2 is set as a "diagnosis target circuit", the pulse generating section 22 sets the second signal SP2 to Low level for a fixed period, as shown in FIG. 6. That is, the pulse generating section 22 generates a second pulse signal PL2 of Low level and outputs the second pulse signal PL2 as the second signal SP2. It can be said that the second pulse signal PL2 is a test pulse for setting the second interruption circuit 10-2 as the "diagnosis target circuit".

It should be noted that, as shown in FIG. 6, the pulse generating section 22 alternately generates the first pulse signal PL1 and the second pulse signal PL2 at different timings from each other.

The first combining section 23-1 receives the common interruption signal SW output from the interruption-signal generating section 21 and the first signal SP1 output from the pulse generating section 22. The first combining section 23-1 generates, based on the common interruption signal SW and the first signal SP1, the first interruption signal SW1 for controlling the first interruption circuit 10-1.

Specifically, while the above-mentioned first pulse signal PL1 is not input, that is, while the first signal SP1 is at High level, the first combining section 23-1 outputs the common interruption signal SW as the first interruption signal SW1. On the other hand, while the first pulse signal PL1 is input, that is, while the first signal SP1 is at Low level, the first combining section 23-1 sets the first interruption signal SW1 OFF (SW1=Low) irrespective of the common interruption signal SW.

Such the function of the first combining section 23-1 can be realized, for example, by an AND gate. In this case, the first combining section 23-1 outputs an AND of the common interruption signal SW and the first signal SP1 as the first interruption signal SW1. The first combining section 23-1 can be realized by a simple configuration, which is preferable.

The second combining section 23-2 receives the common interruption signal SW output from the interruption-signal generating section 21 and the second signal SP2 output from the pulse generating section 22. The second combining section 23-2 generates, based on the common interruption signal SW and the second signal SP2, the second interruption signal SW2 for controlling the second interruption circuit 10-2.

Specifically, while the above-mentioned second pulse signal PL2 is not input, that is, while the second signal SP2 is at High level, the second combining section 23-2 outputs the common interruption signal SW as the second interruption signal SW2. On the other hand, while the second pulse signal PL2 is input, that is, while the second signal SP2 is at Low level, the second combining section 23-2 sets the second interruption signal SW2 OFF (SW2=Low) irrespective of the common interruption signal SW.

Such the function of the second combining section 23-2 can be realized, for example, by an AND gate. In this case, the second combining section 23-2 outputs an AND of the common interruption signal SW and the second signal SP2 as the second interruption signal SW2. The second combining section 23-2 can be realized by a simple configuration, which is preferable.

The monitoring section 24 receives the common interruption signal SW output from the interruption-signal generating section 21, the first signal SP1 and the second signal SP2 output from the pulse generating section 22, the first feedback signal FB1 from the first interruption circuit 10-1, and the second feedback signal FB2 from the second interruption circuit 10-2. The monitoring section 24 monitors, based on the received signals, whether or not the power interrupting device 1 is normal.

For example, in a case where the first interruption circuit 10-1 is the diagnosis target circuit, the first pulse signal PL1 is output as the first signal SP1, and thus the first signal SP1 is at Low level. In this case, the first interruption signal SW1 also is at Low level. If the first interruption circuit 10-1 is normal, the first feedback signal FB1 also is at Low level. Therefore, the monitoring section 24 can determine whether or not an abnormality is occurring in the first interruption circuit 10-1, by comparing the first signal SP1 (i.e., the first pulse signal PL1) and the first feedback signal FB1. If an abnormality is occurring in the first interruption circuit 10-1, the monitoring section 24 outputs an error signal ERR.

Similarly, in a case where the second interruption circuit 10-2 is the diagnosis target circuit, the second pulse signal PL2 is output as the second signal SP2, and thus the second signal SP2 is at Low level. In this case, the second interruption signal SW2 also is at Low level. If the second interruption circuit 10-2 is normal, the second feedback signal FB2 also is at Low level. Therefore, the monitoring section 24 can determine whether or not an abnormality is occurring in the second interruption circuit 10-2, by comparing the second signal SP2 (i.e., the second pulse signal PL2) and the second feedback signal FB2. If an abnormality is occurring in the second interruption circuit 10-2, the monitoring section 24 outputs an error signal ERR.

In this manner, the functions of the control device 20 are realized.

Figure 7:
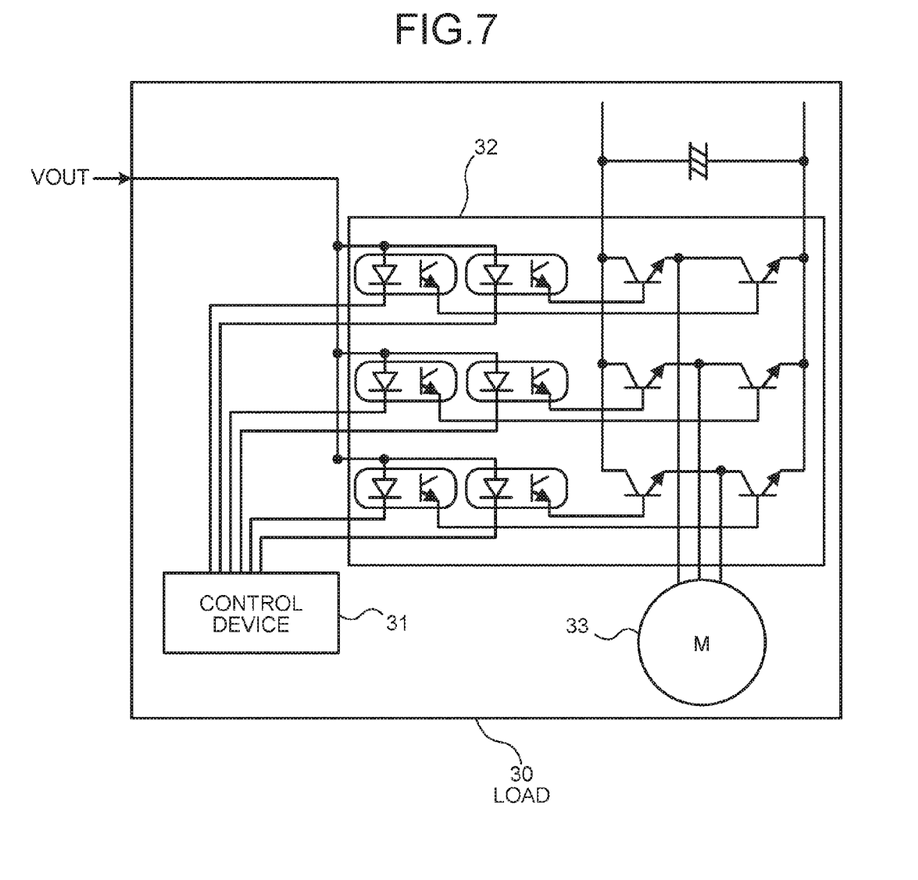
FIG. 7 is a block diagram showing an example of a load in the second embodiment of the present invention.

FIG. 7 is a block diagram showing an example of the load 30 in the present embodiment. In this example, the load 30 is a motor driving device and has a control device 31, a bridge circuit 32, and a motor 33. The control device 31 outputs six PWM signals. The six PWM signals are input to the bridge circuit 32 (a motor driving circuit). The bridge circuit 32 converts the PWM signals into AC voltages for driving the motor 33. Note that the bridge circuit 32 is so configured as not to operate when the output voltage VOUT is at Low level.

The embodiments of the present invention has been described above with reference to the accompanying drawings. However, the present invention is not limited to the above-described embodiments and can be modified as appropriate by those skilled in the art without departing from the spirit of the present invention.

REFERENCE SIGNS LIST 1 power interrupting device, 10 interruption circuit, 10-1 first interruption circuit, 10-2 second interruption circuit, 11 switch element, 11-1 first switch element, 11-2 second switch element, 12 rectifier, 12-1 first rectifier, 12-2 second rectifier, 20 control device, 21 interruption-signal generating section, 22 pulse generating section, 23-1 first combining section, 23-2 second combining section, 24 monitoring section, 30 load, 31 control device, 32 bridge circuit, 33 motor, ERR error signal, FB1 first feedback signal, FB2 second feedback signal, N1 first intermediate node, N2 second intermediate node, OUT output terminal, PL1 first pulse signal, PL2 second pulse signal, SP1 first signal, SP2 second signal, SW common interruption signal, SW1 first interruption signal, SW2 second interruption signal, VOUT output voltage.

The invention claimed is:

1. A power interrupting device comprising:
an output terminal connected to a load;
interruption circuits connected in parallel between a power source and the output terminal; and
a control device to control each of the interruption circuits,
wherein each of the interruption circuits comprises:
a switch element connected between the power source and an intermediate node, and ON/OFF controlled by an interruption signal output from the control device; and
a rectifier connected such that a forward direction thereof is from the intermediate node to the output terminal,
wherein the control device sequentially sets each of the interruption circuits as a diagnosis target circuit in turn, one at a time,
the control device sets, while the interruption circuits are ON, the interruption signal output to the switch element of the set diagnosis target circuit, to turn OFF the set diagnosis target circuit, such that one of the interruption circuits is turned OFF while other interruption circuits remain ON, and
the control device determines, based on a voltage of the intermediate node of the set diagnosis target circuit, whether or not an abnormality has occurred in the set diagnosis target circuit which has been turned OFF, among the interruption circuits, and wherein when interrupting power supply to the load, the control device sets the interruption signal such that the switch elements are OFF in all of the interruption circuits.

2. The power interrupting device according to claim 1, wherein the interruption circuits include:
a first interruption circuit; and
a second interruption circuit,
wherein the control device outputs, as the interruption signal, a first interruption signal and a second interruption signal,
the switch element of the first interruption circuit is ON when the first interruption signal is ON, and is OFF when the first interruption signal is OFF,
the switch element of the second interruption circuit is ON when the second interruption signal is ON, and is OFF when the second interruption signal is OFF, and
the control device alternately turns ON/OFF the first interruption signal and the second interruption signal to alternately set the first interruption circuit and the second interruption circuit as the diagnosis target circuit.

3. The power interrupting device according to claim 2, wherein the control device comprises:
an interruption-signal generating section to generate a common interruption signal;
a pulse generating section to generate a first pulse signal when the first interruption circuit is set as the diagnosis target circuit, and to generate a second pulse signal when the second interruption circuit is set as the diagnosis target circuit;
a first combining section to generate the first interruption signal based on the common interruption signal and the first pulse signal; and
a second combining section to generate the second interruption signal based on the common interruption signal and the second pulse signal,
wherein the first combining section outputs the common interruption signal as the first interruption signal while the first pulse signal is not input, and sets the first interruption signal OFF while the first pulse signal is input, and
the second combining section outputs the common interruption signal as the second interruption signal while the second pulse signal is not input, and sets the second interruption signal OFF while the second pulse signal is input.

4. The power interrupting device according to claim 3, wherein the control device further comprises a monitoring section,
wherein the monitoring section compares the first pulse signal and a voltage of the intermediate node of the first interruption circuit to determine whether or not an abnormality occurs in the first interruption circuit, and
the monitoring section compares the second pulse signal and a voltage of the intermediate node of the second interruption circuit to determine whether or not an abnormality occurs in the second interruption circuit.

* * * * *